(12) United States Patent
Miyamoto

(10) Patent No.: US 6,677,826 B2
(45) Date of Patent: Jan. 13, 2004

(54) CONTROLLING EQUIPMENT AND RADIO EQUIPMENT

(75) Inventor: Muneyasu Miyamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 09/894,059

(22) Filed: Jun. 28, 2001

(65) Prior Publication Data

US 2002/0097099 A1 Jul. 25, 2002

(30) Foreign Application Priority Data

Jan. 22, 2001 (JP) ........................................ 2001-013616

(51) Int. Cl.$^7$ ................................................ H03B 1/00
(52) U.S. Cl. ............................ 331/74; 331/172; 331/55
(58) Field of Search ............................ 331/74, 172, 46, 331/50, 55, 173; 315/241 S, 241 P

(56) References Cited

U.S. PATENT DOCUMENTS 3,764,849 A * 10/1973 Ohta
5,027,039 A * 6/1991 Matsui et al.
6,018,273 A * 1/2000 Tsyrganovich .............. 327/144

FOREIGN PATENT DOCUMENTS

JP 06-252798 9/1994
JP 10-145467 5/1998

* cited by examiner

*Primary Examiner*—Robert Pascal
*Assistant Examiner*—Kimberly E Glenn
(74) *Attorney, Agent, or Firm*—Katten Muchin Zavis Rosenman

(57) ABSTRACT

The invention relates to a controlling equipment for properly maintaining a length of a period where an oscillator is to operate and also relates to a radio equipment incorporating such a controlling equipment. The oscillator is to supply a predetermined signal to a circuit that intermittently operates. A length of time, which is between a first instant and a second instant when the oscillator and the circuit are to initiate operation, respectively, is varied in accordance with a length of time from an initiation of operation of the oscillator to an output signal of the oscillator satisfying a predetermined condition. In an equipment or a system to which the invention is applied, it is possible to flexibly adapt to deviation or fluctuation in its characteristics and to reduce the power consumption.

24 Claims, 10 Drawing Sheets

FIG. 8
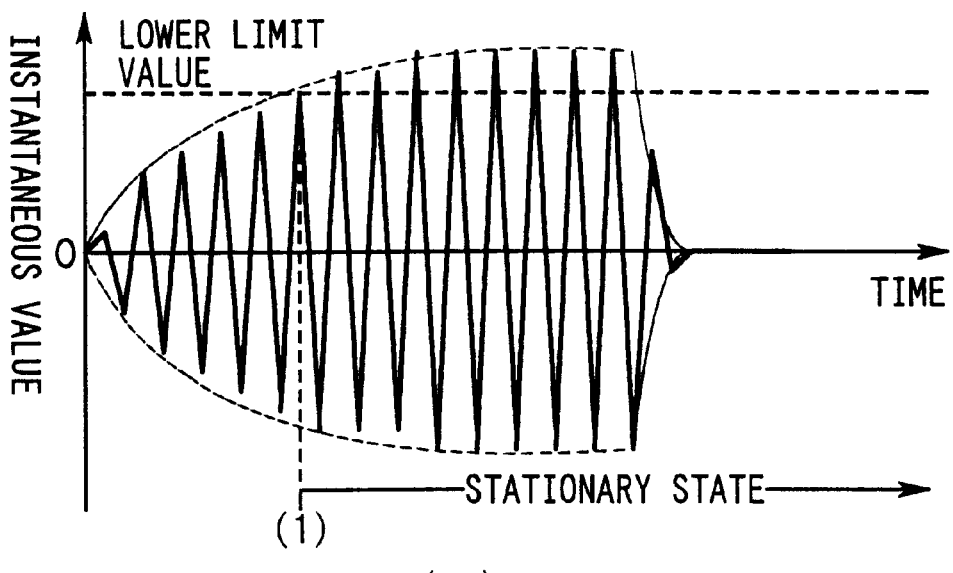
(a)
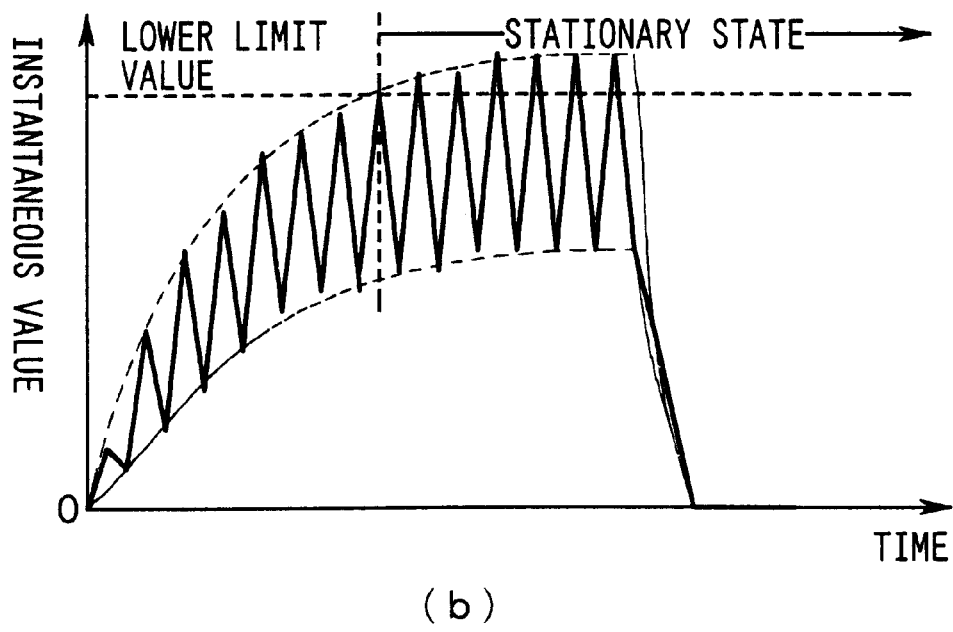
(b)

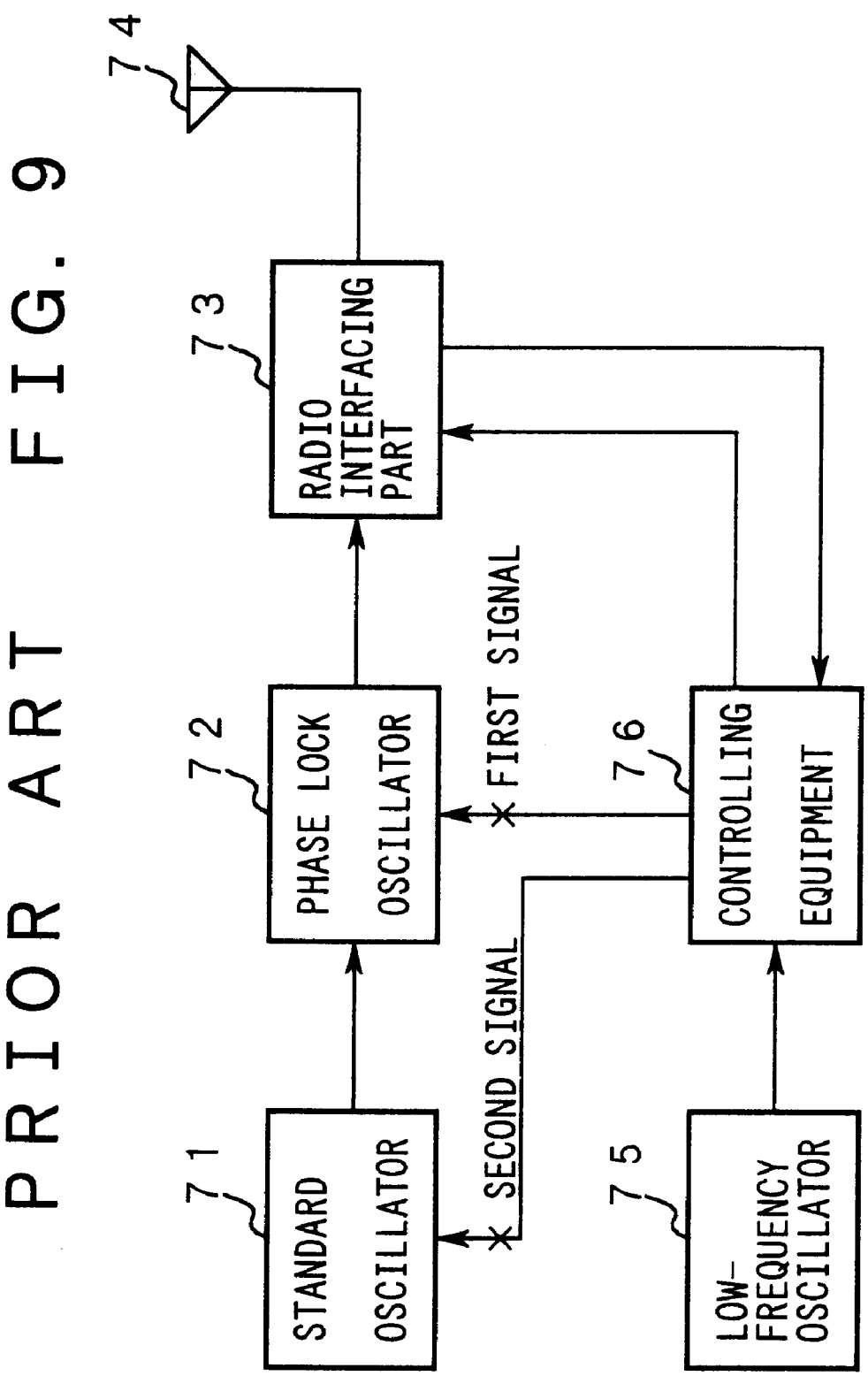
PRIOR ART FIG. 9

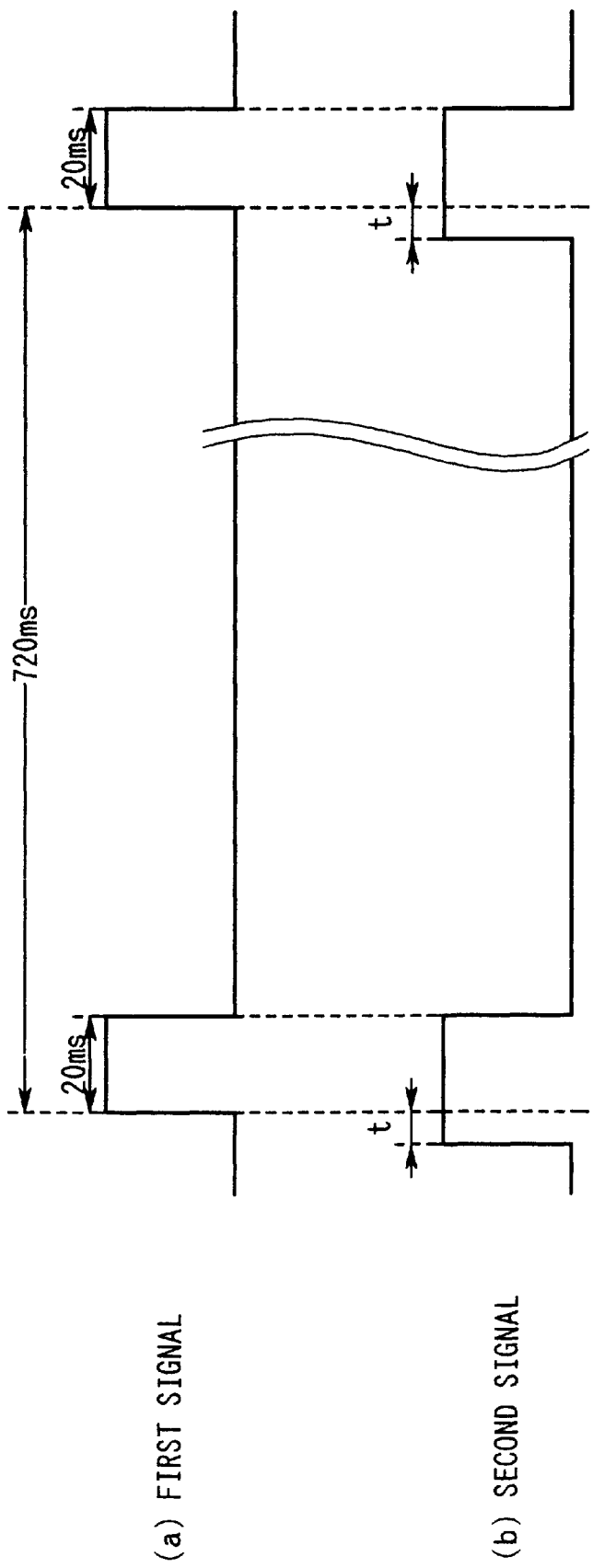

CONTROLLING EQUIPMENT AND RADIO EQUIPMENT

BACKGROUND OF THE INVENTION

1. Field of the Invention

The present invention relates to a controlling equipment, which serves to keep a period at a proper length, in an electronic equipment incorporating an oscillator that operates intermittently. The period is a period where a circuit for performing predetermined processing on a signal generated by the oscillator is to operate or a period which is prior to the above period and where power is to be supplied to the oscillator. The invention also relates to a radio equipment that incorporates such a controlling equipment and forms a predetermined radio transmission path.

2. Description of the Related Art

With deregulation of the market and intense competition between many manufacturers of terminal equipments and between a plurality of communication carriers, the number of subscribers who make use of mobile communication systems have been increasing rapidly.

Among various terminal equipments, portable terminal equipments, in particular, are strongly required to be not only compact and light but also capable of continuously waiting for a termination call for a long time without recharging of a battery.

That is, manufacturers of terminal equipments have been eagerly researching techniques that realizing saving of power consumption without increasing the size and weight because the price performance of a portable terminal equipment are dependent on such techniques.

FIG. 9 shows the configuration example of a conventional terminal equipment where power consumption is reduced during awaiting state.

As shown in FIG. 9, the output of a standard oscillator 71 is connected to the feeding point of an antenna 74 via a phase lock oscillator 72 and a radio interfacing part 73, which are cascaded. The output of the low-frequency oscillator 75 is connected to the clock terminal of a controlling equipment 76. The controlling equipment 76 is provided with a processor (not shown), and the control terminals of the standard oscillator 71 and the phase lock oscillator 72 are connected to predetermined output ports of the processor. The input/output terminals of the radio interfacing part 73 are connected to other particular input/output ports, respectively, of the controlling equipment 76 (processor).

In the terminal equipment having the above configuration, the low-frequency oscillator 75 constantly generates a clock signal of 32 kHz, for example, and supplies it to the controlling equipment 76.

The controlling equipment 76 operates under the initiative of the processor and has first and second frequency dividers (now shown).

The first frequency divider constantly generates a first signal (see FIG. 10A) having a cycle of 720 ms (=(1/(32× $10^3$))×2,304) and a duty factor of 1/36 (=20 ms/720 ms=640/ 23,040), for example, by frequency-dividing the above-mentioned clock signal.

By frequency-dividing the above-mentioned clock signal parallel with the frequency division by the first frequency divider, the second frequency divider constantly generates a second signal (see FIG. 10B) that satisfies all the following conditions, for example:

Rises before the first signal by a maximum time t that is necessary for the standard oscillator 71 to initiate a stationary operation.

Falls at the same as the first signal.

The controlling equipment 76 causes the phase lock oscillator 72 to operate only in a first period while the first signal has a logical value "1" and causes the standard oscillator 71 to operate only in a second period while the second signal has a logical value "1."

The standard oscillator 71 starts operating at the start point of the second period, and generates, with predetermined accuracy, a reference signal whose frequency is equal to a predetermined frequency (e.g., 16 MHz) after a lapse of the above-mentioned maximum time t in the second period.

The phase lock oscillator 72 starts operating at the start point of the first period. That is, the phase lock oscillator 72 supplies a local frequency signal having a regular frequency to the radio interfacing part 73 in a stable manner by performing frequency synthesis on only the effective, stable reference signal.

The controlling equipment 76 takes initiative in determining operating conditions of the radio interfacing part 73 under a channel control that is performed by the above-mentioned processor according to a stored program control method.

Incidentally, in the above conventional example, the time difference between the rise of the first signal and the rise of the second signal is set at the above-mentioned maximum time t where stable supply of the above-mentioned local frequency signal is enabled, because the time t necessary for the standard oscillator 71 to initiate a stationary operation varies depending on the environmental conditions such as the temperature.

Further, the maximum time t has to include a predetermined margin to accommodate dispersion etc. of the components of the standard oscillator 71.

As a result, the standard oscillator 71 operates for more than a periods where the above-mentioned local frequency signal should be supplied.

The above problems can be solved by using any of the following techniques:

A first technique in which the time necessary for an initiation of a stationary operation is actually measured for each standard oscillator 71 incorporated in an equipment and the measured time or a possible maximum value of the measured time due to a deviation etc. of the environmental conditions is used instead of the above-mentioned maximum time t.

A second technique in which a highly stable crystal oscillator with high accuracy and stability in oscillating frequency is used as the standard oscillator 71.

However, where the first technique is applied, a large amount of man-hour is necessary to actually measure the time required for initiation of stationary operation of each standard oscillator 71, to reflect a measurement result, etc. on the power controlling equipment 76.

Where the second technique is used, there will be a high possibility of an increase in the hardware cost, the mounting space, and power consumption.

In practice, it is difficult to realize either of the above techniques which have a factor of preventing price reduction or downsizing required for mass-produced terminal equipments.

SUMMARY OF THE INVENTION

An object of the present invention is to provide a controlling equipment and a radio equipment capable of realizing a reduction in useless power consumption of an oscillator that intermittently operates.

Another object of the invention is to reliably and stably reduce the power consumption and the costs including the running cost of an equipment or a system to which the invention is applied, and to highly maintain the reliability of such an equipment and system without deteriorating performance, characteristics, or service quality.

A further object of the invention is to properly and automatically set an instant at which an oscillator initiates operation in accordance with its characteristics, in an equipment comprising a circuit such as a receiving part that operates according to a signal generated by the oscillator intermittently oscillating.

The invention provides a controlling equipment where an actual initiation time taken for an initiation of stationary operation of an oscillator is monitored and power is started to be supplied to the oscillator at an instant that precedes, by a length of the initiation time, an instant where a circuit is to initiate its operation. The circuit is provided subsequently to the oscillator and is to intermittently operate.

In this controlling equipment, the oscillator operates in a stationary state before an instant where the circuit starts a stationary operation, thereby preventing useless power consumption of the oscillator before the instant.

According to another aspect of the invention, there is provided a controlling equipment where a minimum value of the initiation time is given in advance to employ, as an actual initiation time, a larger one of the minimum value and an actually monitored initiation time.

This controlling equipment realizes power saving and cost reduction without performing complex arithmetic operations as long as the above minimum value is proper.

According to another aspect of the invention, there is provided a controlling equipment where: an average value of actually monitored initiation time is applied when the average value is constant; a value larger than the average value is applied when the average value increases; and a value smaller than the average value is applied when the average value decreases.

This controlling equipment attains power saving with high reliability without frequently or excessively varying the time required for an initiation of stationary operation of an oscillator due to a variation in the characteristics etc. of the oscillator.

According to still another aspect of the invention, there is provided a controlling equipment that monitors an initiation time.

This controlling equipment attains power saving with high reliability even in a case where the initiation time may vary frequently or rapidly.

According to yet another aspect of the invention, there is provided a controlling equipment where the sum of a monitored initiation time and a predetermined margin is used for determining an instant at which an oscillator starts.

This controlling equipment enables power saving and cost reduction without performing complex arithmetic operations as long as the margin is proper.

According to a further aspect of the invention, there is provided a radio equipment incorporating the controlling equipment which has the initiative of determining an instant at which an oscillator is to initiate an operation. The oscillator is to operate for intermittently receiving a signal coming from a base station.

This radio equipment makes it possible to highly reliably maintain power saving by intermittently receiving the above signal; to reduce the running cost; and to reduce the capacity of battery and increase the time for continuously waiting a call or enable flexible use of an added value, particularly in a case where the driving power is supplied from a battery,

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIGS. 8A and 8B show the operation of the fourth embodiment of the invention;

FIG. 9 shows the configuration example of a conventional terminal equipment where power consumption is reduced during waiting; and FIGS. 10A and 10B show operation of the conventional terminal equipment of FIG. 9.

DESCRIPTION OF THE PREFERRED EMBODIMENTS

Figure 1:
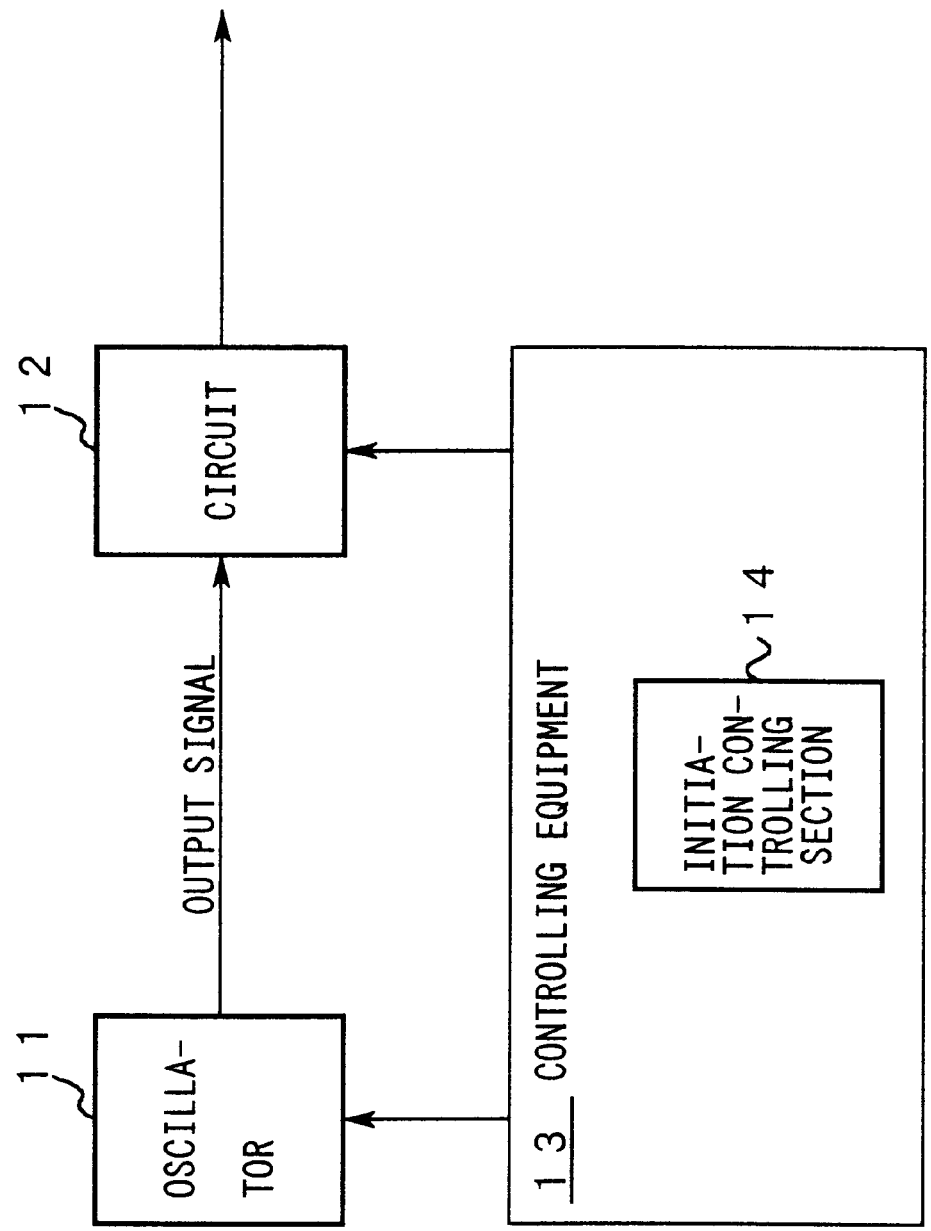
FIG. 1 is a block diagram showing the principle of a first controlling equipment according to the present invention.

First, the principles of controlling equipments according to the present invention will be described with reference to FIG. 1. FIG. 1 is a block diagram showing the principle of a first controlling equipment according to the invention.

The controlling equipment shown in FIG. 1 is composed of an oscillator 11, a circuit 12 that operates according to an output signal of the oscillator 11, and a controlling equipment 13 for performing initiation controls of the oscillator 11 and the circuit 12. The controlling equipment 13 has an initiation controlling section 14.

The principle of the first controlling equipment according to the invention is as follows.

The first controlling equipment according to the invention repeatedly executes an initiation processing to initiate operation of the oscillator 11 at a first instant and operation of the circuit 12, at a second instant delaying from the first instant. The circuit 12 is to operate according to an output signal of the oscillator 11.

That is, the controlling equipment 13 initiates the oscillator 11 at the first instant, initiates the circuit 12 at the second instant delaying from the first instant, and stops the operations of both of the oscillator 11 and the circuit 12. Then, the controlling equipment 13 repeatedly executes the initiation processing to initiate the operation of the oscillator 11 at the first instant and the operation of the circuit 12 at the second instant.

The initiation controlling section 14 provided in the controlling equipment 13 varies a length of time, which is between the first instant and the second instant in an Nth initiation processing, in accordance with a length of time from an initiation of operation of the oscillator 11 to the output signal of the oscillator 11 satisfying a predetermined condition, during a (N−1) th or any one of its preceding initiation processings.

That is, the length of time between the first instant and the second instant is varied and optimized in accordance with a length of time from an initiation of operation of the oscillator 11 to the output signal having a desired output. Therefore, the time (hereinafter will be referred to as "standby time") by which the first instant is to advance the second instant is set at a minimum value, thereby reducing the useless power consumption of the oscillator 11s.

When it is possible to set the time between the first instant and the second instant at two different values of T1 and T2 (T1<T2) at least, the controlling equipment 13 may execute any one of the following processings in replace of the above processing that is executed by the initiation controlling section 14:

The time is set at T1 when the maximum value of the time taken is shorter than T1. The time is from an initiation of operation of the oscillator 11 to the output signal of the oscillator 11 satisfying the predetermined condition during the (N−1) th or any one of its preceding processings.

The time is set at T2 when the maximum value of the time taken is longer than or equal to T1.

That is, the Nth standby time is properly set to one of the minimum standby times not over the maximum standby time taken during the (N−1) th or any one of its preceding initiation processings.

Therefore, the power consumption of the oscillator 11 can be decreased compared with a case where the standby time is set to a constant value.

Since the standby time is set based on the maximum time, setting an excessively short standby time can be prevented. This further prevents the subsequent circuit 12 from initiating an operation before the output signal of the oscillator 11 becomes stable.

The controlling equipment 13 according to the invention may execute one of the following processings in replace of the above processing that is executed by the initiation controlling section 14:

Set a time to be long, which is between the first instant and the second instant in the Nth initiation processing, when the average value of a time is large. The time is from an initiation of operation of the oscillator 11 to the output signal of the oscillator 11 satisfying the predetermined condition during the (N−1)th or any one of its preceding initiation processings.

Conversely, set the time to be short when the average value is small.

Since a minimum standby time as a previous result is subjected to averaging, it can be prevented that the standby time varies quickly in accordance with its one sudden variation.

Figure 2:
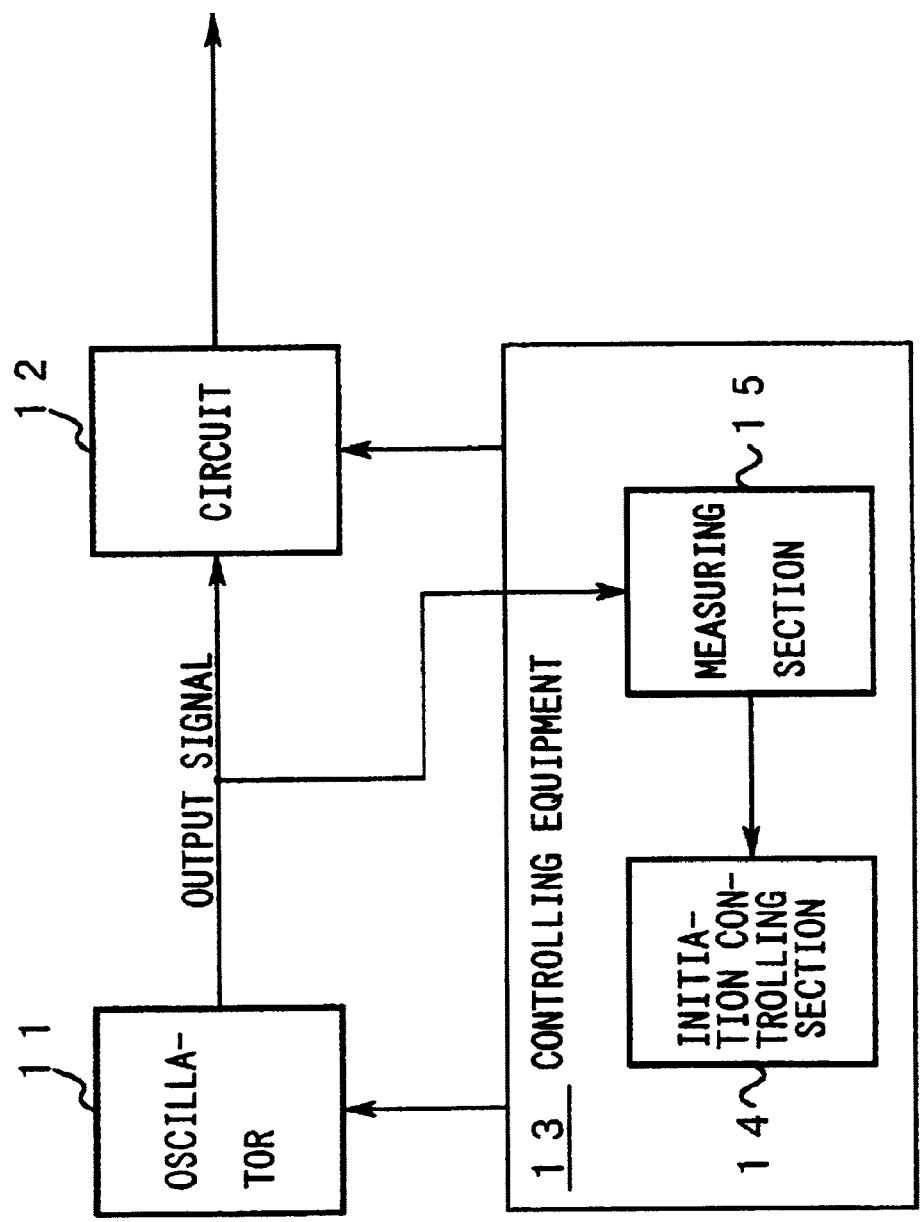
FIG. 2 is a block diagram showing the principle of a second controlling equipment according to the invention.

FIG. 2 is a block diagram showing the principle of a second controlling equipment according to the invention.

The controlling equipment shown in FIG. 2 is composed of an oscillator 11, a circuit 12 that uses an output signal of the oscillator 11, and a controlling equipment 13 for initiating the oscillator 11 and the circuit 12. The controlling equipment 13 has an initiation controlling section 14 and a measuring section 15.

The principle of the second controlling equipment according to the invention is as follows.

The second controlling equipment according to the invention repeatedly executes an initiation processing to initiate operation of the oscillator 11 at a first instant and operation of the circuit 12 at a second instant that delays from the first instant.

That is, the controlling equipment 13 initiates the oscillator 11 at the first instant, the circuit 12 at the second instant delaying from the first instant, and stops the operations of both of the oscillator 11 and the circuit 12. Then, the controlling equipment 13 repeatedly executes the initiation processing to initiate the operation of the oscillator 11 at the first instant and the operation of the circuit 12 at the second instant.

The measuring section 15 provided in the controlling equipment 13 measures a length of time in each initiation processing by monitoring the output signal of the oscillator 11. The length of time is from an initiation of operation of the oscillator 11 to the output signal of the oscillator 11 satisfying a predetermined condition. The initiation controlling section 14 varies the time between the first instant and the second instant in accordance with a measurement result.

Therefore, a shortest standby time to be secured is accurately measured since the measuring section 15 directly measures the output signal of the oscillator 11. The initiation controlling section 14 can optimize the next standby time using the measurement result.

The principle of a third controlling equipment according to the invention is as follows.

In the third controlling equipment according to the invention, the measuring section 15 measures a length of time in each initiation processing. The length of time is from an initiation of operation of the oscillator 11 to the output signal of the oscillator 11 satisfying a predetermined condition. The initiation controlling section 14 sets a time between the first instant and the second instant at a value obtained by adding a predetermined time to the measured time.

As a result, the oscillator 11 and the circuit 12 are hold on to initiate an operation until a time, which is equal to a sum of an actual time taken for initiation of stationary operation of the oscillator 11 and a margin equal to the above predetermined time, elapses.

Therefore, as long as the margin is proper, the power consumption can be reduced stably with high reliability.

Figure 3:
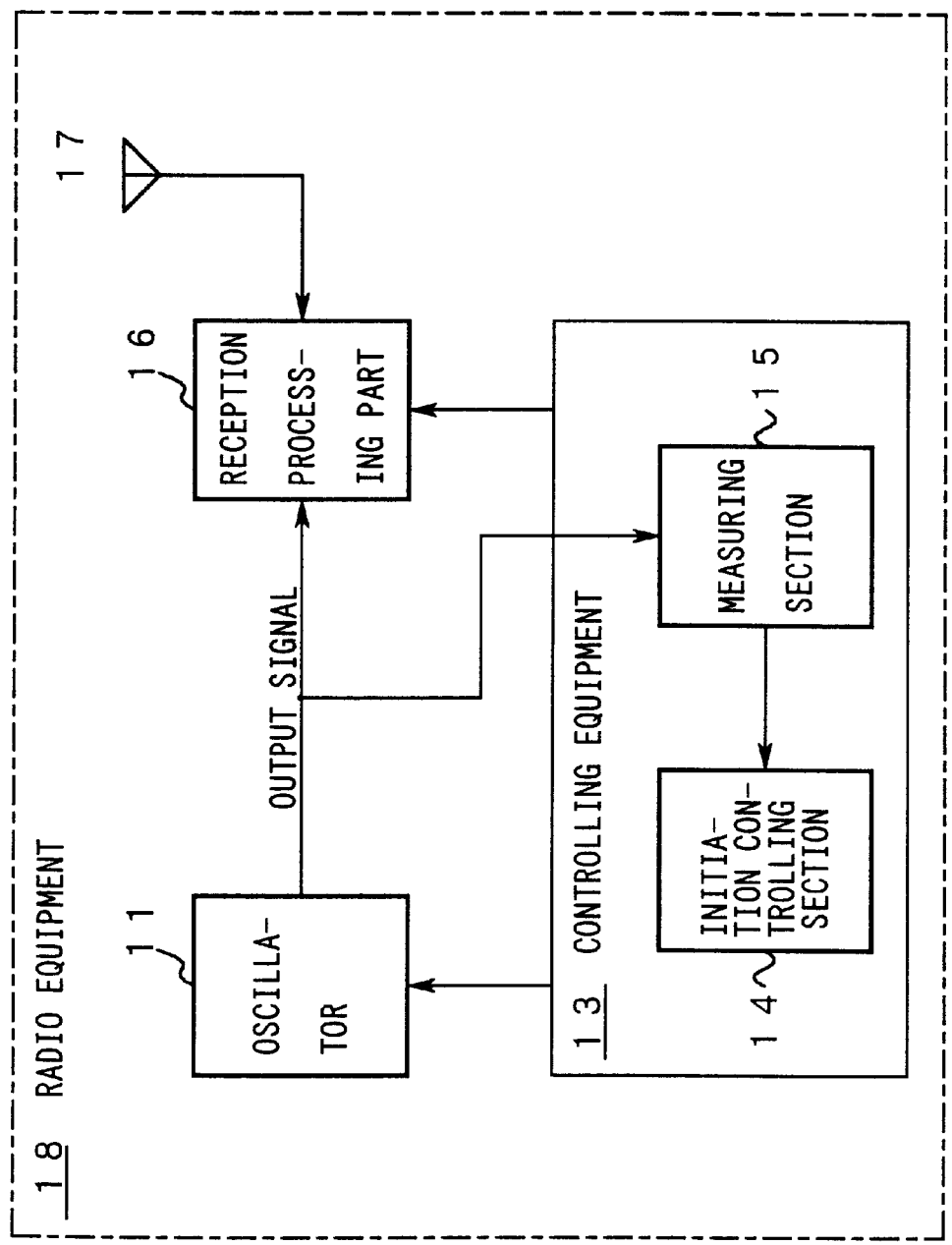
FIG. 3 is a clock diagram showing the principle of a radio equipment according to the invention.

FIG. 3 is a block diagram showing the principle of a radio equipment according to the invention.

The radio equipment shown in FIG. 3 is composed of an oscillator 11, a reception processing part 16 that uses an output signal of the oscillator 11, an antenna 17, a controlling equipment 13 that performs initiation controls of the oscillator 11, and the reception processing part 16. The controlling equipment 13 has an initiation controlling section 14 and a measuring section 15.

The principle of the radio equipment according to the invention is as follows.

The radio equipment according to the invention is provided with the oscillator 11 that is initiated by the controlling equipment 13 and the reception processing part 16 that starts, under the controlling equipment 13, reception processing on a radio signal received by the antenna 17. The controlling equipment 13 initiates the oscillator 11 at a first instant and the reception processing part 16 at a second instant that delays from the first instant. The reception processing part 16 intermittently performs reception processing at a predetermined cycle that corresponds to a signal coming from a base station.

The measuring section 15 provided in the controlling equipment 13 repeatedly measures a time in each reception processing. The time is from an initiation of operation of the oscillator 11 to the output signal of the oscillator 11 satisfying a predetermined condition. The initiation controlling section 14 provided in the controlling equipment 13 varies the first instant in accordance with measurement results.

Therefore, in the radio equipment according to the invention, it is possible to optimize the time for which the oscillator 11 is to wait when intermittently receiving a signal coming from a base station and reduce the power consumption, which increases the portability and realizes energy saving.

FIGS. 1–3 do not show how power is applied to the oscillator 11, the circuit 12, and the reception processing part 16. This is because the oscillator 11, the circuit 12, and the reception processing part 16 are initiated according to at least the two following ways:

The oscillator 11, the circuit 12, and the reception processing part 16 are always supplied with power from a power supplying part (not shown) and their operations stops or starts according to control signals (e.g., power saving signals) supplied from the controlling equipment 13.

The controlling equipment 13 directly starts or stops the power supply to the oscillator 11, the circuit 12, and the reception processing part 16.

That is, the oscillator 11, the circuit 12, and the reception processing part 16 starts or stops their operations under control of the controlling equipment 13.

In the above-described controlling equipments and the radio equipment, the predetermined condition may include one of a condition that the frequency of an output signal of the oscillator 11 measured by a frequency measuring section (for measuring the frequency of a signal) has exceeded a predetermined value and a condition that the level of an output signal of the oscillator 11 measured by a level measuring section (for measuring the level of a signal) has exceeded a predetermined value.

In this case, an instant at which the oscillator 11 initiates a stationary operation is simply determined based on a reference set for one or both of the frequency and the level of a signal generated by the oscillator 11.

Therefore, as long as such a reference is set properly, the power consumption can be reduced with high reliability.

In the above-described controlling equipments and radio equipment, the above-described predetermined condition may include a condition that the frequency of an output signal of the oscillator 11 measured by a frequency measuring section (for measuring the frequency of a signal) reaches a predetermined value within predetermined accuracy.

In this case, an instant at which the oscillator 11 initiates a stationary operation is simply determined based on a reference relating to the frequency of a signal generated by the oscillator 11.

Therefore, as long as the reference is set properly, the configuration can be simplified without deterioration in performance.

In the above-described controlling equipments and the radio equipment, the predetermined condition may include either a condition that the frequency of an output signal of the oscillator 11 measured by a frequency measuring section (for measuring the frequency of a signal) has exceeded a predetermined value or a condition that the level of an output signal of the oscillator 11 measured by a level measuring section (for measuring the level of a signal) has exceeded a predetermined value.

In this case, an instant at which the oscillator 11 initiates a stationary operation is determined based on references set for both of the frequency and the level of a signal generated by the oscillator 11.

Therefore, the useless power consumption of the oscillator 11 or the circuit 12 can be reduced with higher reliability than in the case where an instant at which the oscillator 11 initiates a stationary operation is determined based on a reference that relates to only one of the frequency and the level of a signal generated by the oscillator 11.

Embodiments of the invention will be hereinafter described in detail with reference to the accompanying drawings.

Figure 4:
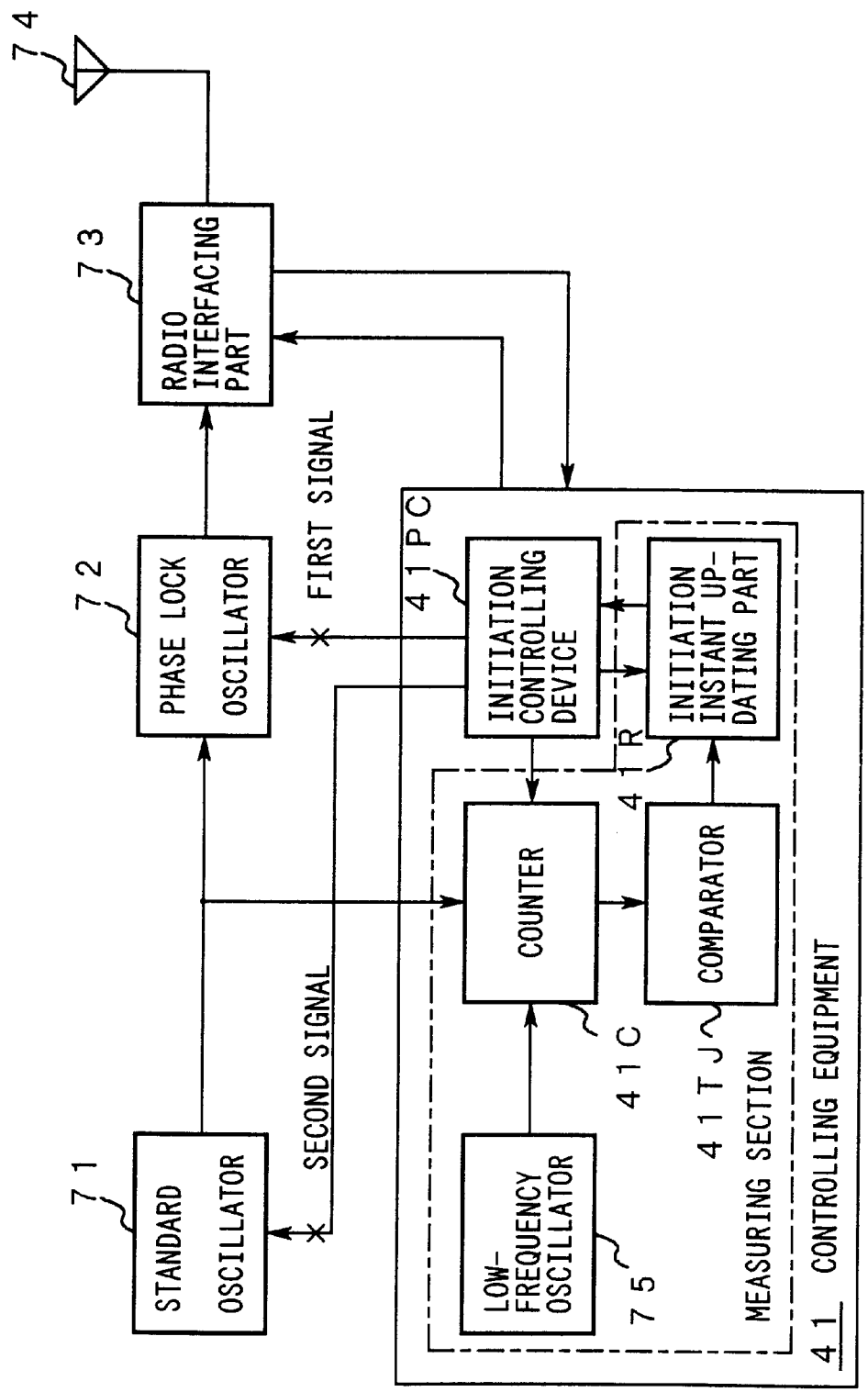
FIG. 4 shows a first embodiment and a second embodiment of the invention

FIG. 4 shows a first embodiment and a second embodiment of the invention.

The embodiments in FIG. 4 are radio equipments (e.g., portable terminal equipments) according to the invention. Each of the radio equipments is composed of a standard oscillator 71, a phase lock oscillator 72, a radio interfacing part 73, an antenna 74, and a controlling equipment 41. The controlling equipment 41 has a low-frequency oscillator 75, a counter 41C, an initiation controlling equipment 41PC, a comparator 41TJ, and an initiation instant updating part 41R.

The standard oscillator 71 is an example of the oscillator 11, and the phase lock oscillator 72 is an example of the circuit 12 that uses an output signal of the oscillator 11. The phase lock oscillator 72 and the radio interfacing part 73 are an example of the reception processing part 16, and the combination of the low-frequency oscillator 75, the counter 41C, and the initiation instant updating part 41R is an example of the measuring section 15. The initiation controlling equipment 41PC is an example of the initiation controlling section 14.

The input of the counter 41C is directly connected to the output of the standard oscillator 71 and the output of the low-frequency oscillator 75 is directly connected to the enable terminal of the counter 41C. The initiation controlling equipment 41PC has an output terminal that is connected to the reset terminal of the counter 41C. The input of the comparator 41TJ is directly connected to the parallel output of the counter 41C. The output of the comparator 41TJ is directly connected to the first input of the initiation instant updating part 41R, and the second input and the output of the initiation instant updating part 41R is directly connected to a corresponding output and input of the initiation controlling equipment 41PC, respectively.

Figure 5:
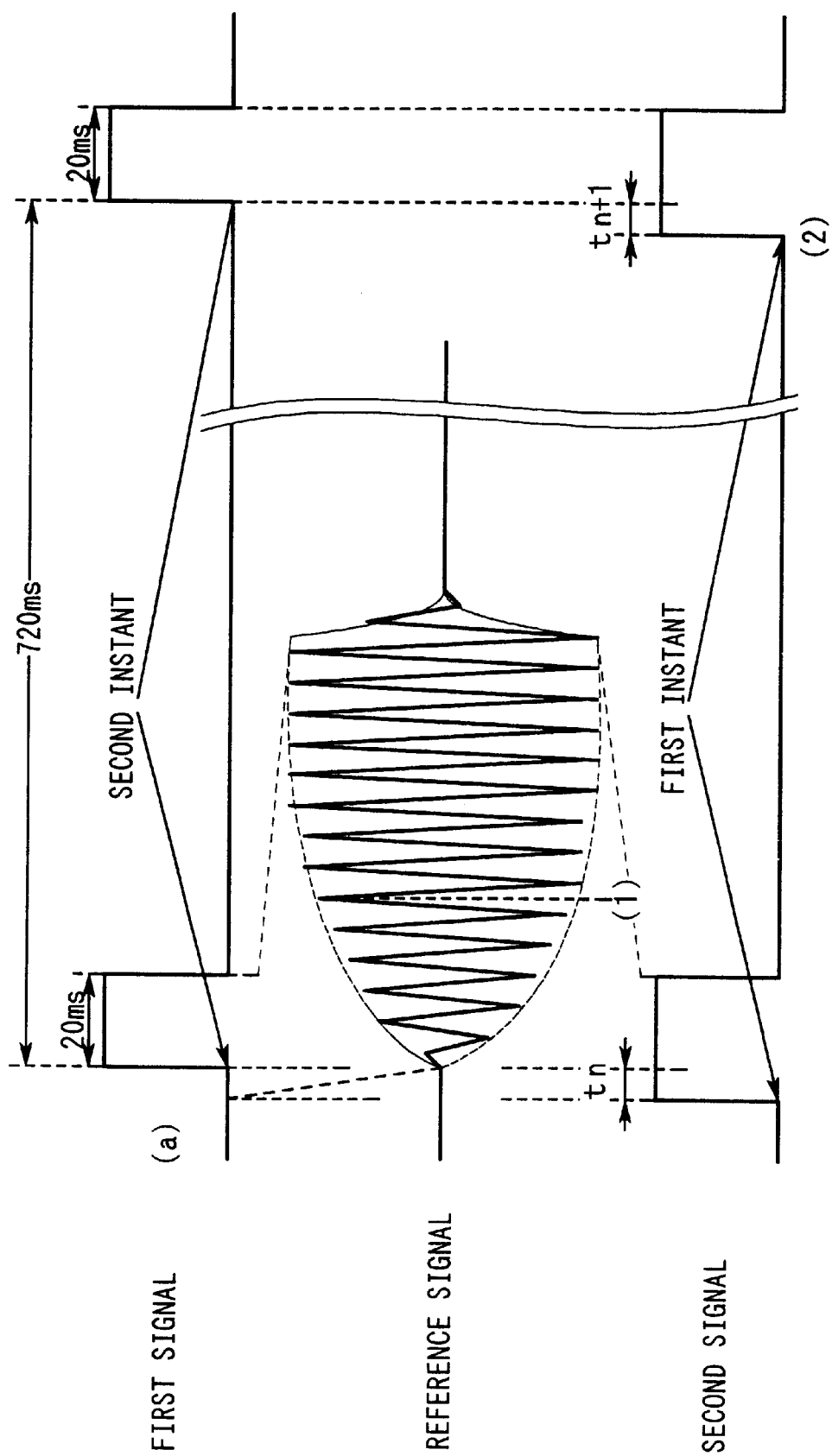
FIG. 5 shows the operation of the first embodiment.

FIG. 5 shows the operation of the first embodiment of the invention. The operation of the first embodiment of the invention will be described below with reference to FIGS. 4 and 5.

An important feature of this embodiment is the procedure of the following processing that is executed by the controlling equipment 41 to generate the "second signal."

As in the case of the conventional example, the low-frequency oscillator 75 generates a clock signal (e.g., 32 kHz) constantly.

Having a frequency divider (not shown), the initiation controlling equipment 41PC that is provided in the controlling equipment 41 generates a first signal (see part (a) of FIG. 5) by frequency-dividing the clock signal as in the case of the conventional example. It is assumed that the clock signal rises, for example, at the same cycle as transmission waves coming from a radio base station should be received intermittently as long as this embodiment is applied to a portable terminal equipment.

The initiation controlling equipment 41PC is given a measurement time tn by the initiation instant updating part 41R, and generates a second signal while maintaining synchronization with the first signal in the following manner.

In the following description, a time that is measured by the initiation instant updating part 41R is represented by "tn" in accordance with an Nth rise of the second signal that is output from the initiation controlling equipment 41PC. It is desirable that when no such time has been measured (at an instant t0 corresponding to n=0), the measurement time be set at a value that is equal to the maximum value t in the conventional example.

The second signal rises (n+1)th time at an instant that advances the instant of an (n+1)th rise of the first signal by the time tn.

The second signal falls at the same time as the first signal.

The initiation controlling equipment 41PC causes the standard oscillator 71 to operate only in a first period while the second signal has a logical value "1" and causes the phase lock oscillator 72 to operate only in a period while the first signal has a logical value "1."

Conversely, the above logical values of the first signal and the second signal may be "0."

As long as a processing of initiating the standard oscillator 71 and the phase lock oscillator 72 is realized, the following configuration, for example, may be employed:

The first signal and the second signal are used as power saving signals. The standard oscillator 71 and the phase lock oscillator 72 go into a power saving state in periods while the logical values of the second signal and the first signal are at a low level, respectively, and operate in periods while the logical values of the second signal and the first signal are at a high level, respectively.

The initiation controlling part 41PC supplies power to the standard oscillator 71 and the phase lock oscillator 72 in the above periods while the logical values of the second signal and the first signal are at a high level, respectively.

At an instant when to initiate the standard oscillator 71 nth time, the initiation controlling equipment 41PC gives the counter 41C a reset signal and gives the initiation instant updating part 41R a notice of the effect (initiation notice).

Every time receiving the above notice (initiation notice), the initiation instant updating part 41R starts measuring an elapsed time T from the reception of the notice.

The counter 41C measures the frequency of a reference signal that is supplied from the standard oscillator 71 by counting the number (Cl) of clocks that have been received from the low-frequency oscillator 75 and that rose after the reception of the reset signal, and supplies a measurement result to the comparator 41TJ.

The comparator 41TJ is given in advance, as an equivalent of a nominal value of the frequency of the reference signal to be generated by the standard oscillator 71, a reference number Cr for the measurement number C1.

Further, the comparator 41TJ judges whether the number C1 has become greater than or equal to the reference number Cr. When the judgment result has turned true (indicated by symbol (1) in FIG. 5), the comparator 41TJ supplies a notice (completion notice) indicating the judgment result to the initiation instant updating part 41R.

In response to the initiation notice, the initiation instant updating part 41R notifies the initiation controlling equipment 41PC of a time tn that has elapsed to the instant when the initiation instant updating part 41R receives the completion notice.

The initiation controlling equipment 41PC sets the (n+1)th rise instant (indicated by symbol (2) in FIG. 5) of the second signal at an instant that precedes the (n+1)th rise of the first signal by the time tn.

That is, the difference between the instant when the standard oscillator 71 is initiated and the instant when the phase lock oscillator 72 is initiated is given as the time (hereinafter referred to as "actual measurement time") that elapsed actually from the instant when the standard oscillator 71 was initiated to the instant when the frequency of the reference signal that is the output signal of the standard oscillator 71 became equal to the above-mentioned nominal value.

Therefore, the initiation instant of the standard oscillator 71 need not precede that of the phase lock oscillator 72 by an unduly long time even in a case where the time taken for the standard oscillator 71 to initiate a stationary operation may vary due to either of the following events:

A variation in the environmental conditions (including the power supply voltage).

A variation (including a secular variation) in the characteristics of the standard oscillator 71.

In a radio equipment incorporating a controlling equipment that executes the initiation processing to initiate operations of the standard oscillator at the first instant and operations of the phase lock oscillator at the second instant that delays from the first instant, it is desirable that the initiation controlling part vary the time between the first instant and the second instant in an Nth initiation processing in accordance with a time(s) from an instant when the standard oscillator started operating to an instant when the output signal of the standard oscillator came to satisfy a predetermined condition during a (N−1)th or any one of its preceding initiation processings.

That is, the time from an instant when the standard oscillator 71 starts operating to an instant when the output signal of the standard oscillator 71 came to satisfy the predetermined condition (in this case, the condition that the frequency of the output signal becomes the predetermined value) in the (N−1)th initiation processing, for example, is measured through cooperation of the counter 41C, the comparator 41TJ, the initiation instant updating part 41R, etc., and the difference between the first instant and the second instant is kept equal to the measured time.

For example, one of the following values may be used instead of the measured time:

An average value or a maximum value of times that are likewise measured in the preceding (N−2)th and (N−1)th initiation processings.

An average value or a maximum value of times that are likewise measured in the (N−i)th (i: natural number greater than or equal to 3) and (N−1)th initiation processings.

An average value (weighted average, ordinary average, or the like) or a maximum value of times that are likewise measured in the (N−i)th, (N−j)th, . . . , (N−1)th (i>j> . . . >1; i, j: natural number) initiation processings.

When the maximum value determined in the above manner is smaller than a predetermined value T1, then the time between the first instant and the second instant may be set at T1. When the maximum value is greater than a predetermined value T1 and smaller than another predetermined value T2 (T1<T2), the time between the first instant and the second instant may be set at T2. However, it is desirable that: T1 be longer than a necessary time, which is from an initiation of operation of the standard oscillator 71 to the output of the standard oscillator 71 satisfying the predetermined condition in a shortest time; and T2 be shorter than the sum of a predetermined time and a maximum time necessary for the output of the standard oscillator 71 to satisfy the predetermined condition (except for a case of a fault or the like).

The operation of a second embodiment of the invention will be hereinafter described with reference to FIG. 4.

The initiation controlling equipment 41PC integrates times tn that are supplied from the initiation instant updating part 41R in the above-described time-series order with corresponding, predetermined weighting and obtains an integration result Tn.

The initiation controlling equipment 41PC sets the rise instant of the second signal at an instant that delays by the time Tn from the rise instant of the first signal.

According to this embodiment, even if the time taken for the standard oscillator 71 to initiate a stationary operation varies due to a quick variation in the environment etc., the instant when the phase lock oscillator 72 starts operating is kept stable without uselessly following such a variation.

In this embodiment, there is no specific disclosure as to other variations of the algorithm and the weighting to be used in integrating times tn that are supplied from the initiation instant updating part 41R in the above-described time-series order.

However, the above integration can be realized by using any of various known algorithms such as the moving average method and the exponential smoothing method. Weights to be used in such an algorithm may be set at any values as long as they are so small that the accuracy of the rise instant of the second signal (i.e., the power that is supplied to the standard oscillator 71 uselessly) is allowable.

In this embodiment, the above-described weights are constants. However, as long as desirable performance is attained with adaptation to, for example, the configurations (including the circuit types) and those characteristics of the respective parts, variations (including a secular variation) in the environmental conditions (including the power supply voltage), the weights may be constants or variables that satisfy either of the following conditions:

Quick response to times tn that were obtained in advance in the above-described time-series order is assured or prohibited.

No response is made for a desired time or more to times tn that were obtained at the preceding instants.

Figure 6:
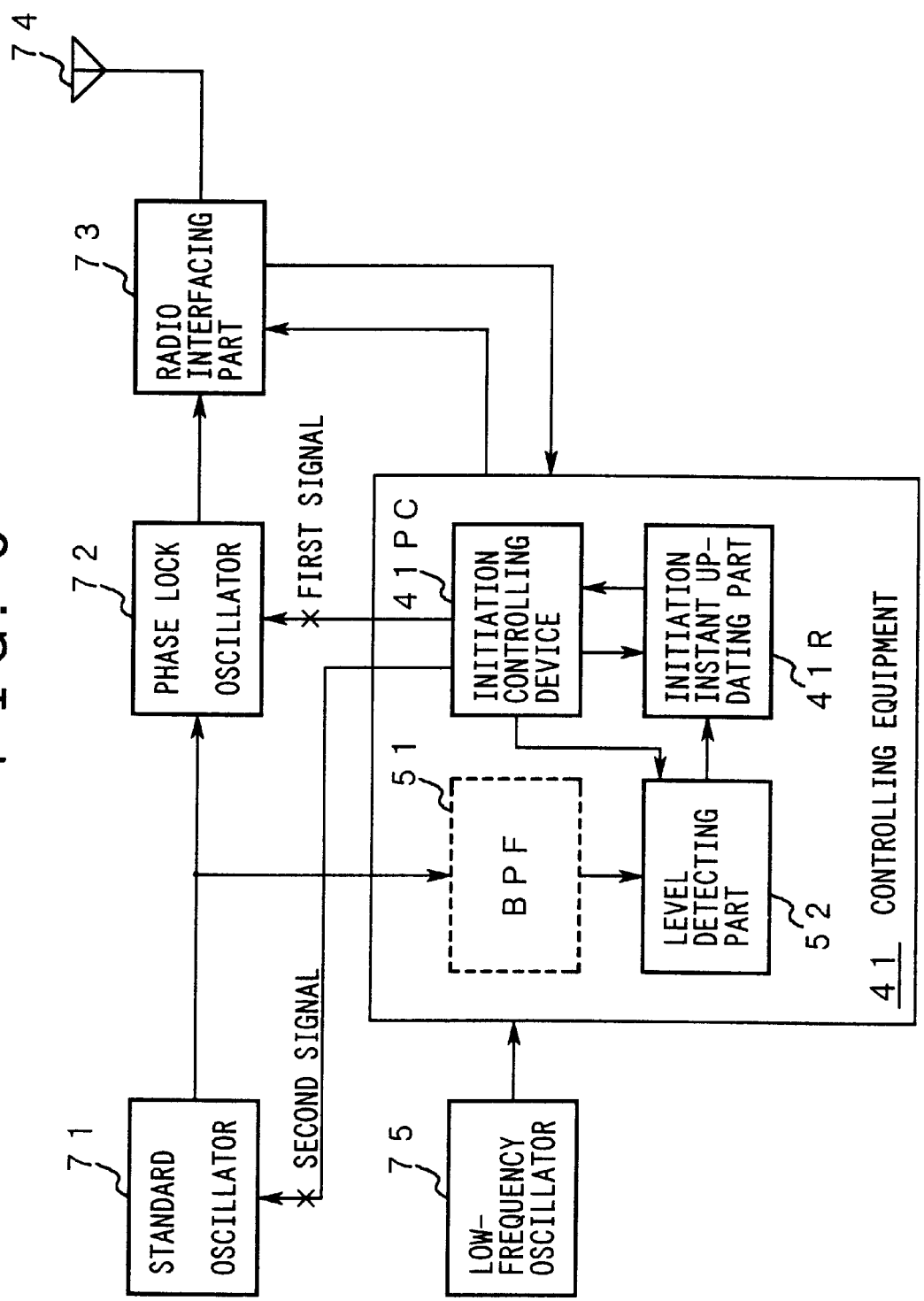
FIG. 6 shows a third embodiment of the invention.

FIG. 6 shows a third embodiment of the invention.

The parts in FIG. 6 having the same functions and configuration as the corresponding parts in FIG. 4 are given the same reference symbols and will not be described.

Main features of this embodiment are as follows:
A bandpass filter (BPF) 51 is provided.
A level detecting part 52 is provided.
A corresponding output of the initiation controlling equipment 41PC is connected to the control input of the level detecting part 52.

The operation of the third embodiment of the invention will be described below with reference to FIG. 6.

The bandpass filter 51 has a sharp and narrow pass-band that includes the nominal value of the frequency of a reference signal to be generated by the standard oscillator 71.

At an instant when to initiate the standard oscillator 71, the initiation controlling equipment 41PC gives the level detecting part 52 a reset signal and gives the initiation instant updating part 41R a notice (initiation notice) of the effect.

Every time receiving the above notice (initiation notice), the initiation instant updating part 41R starts measuring a time tn from the reception of the notice to reception of a notice (completion notice; described later) that will be supplied from the level detecting part 52.

The bandpass filter 51 outputs a monitoring signal that is generated by the standard oscillator 71 and has only a component in the above-mentioned pass-band.

The level detecting part 52 is given in advance a threshold value that the level of the monitoring signal should exceed when the standard oscillator 71 initiates a stationary operation. After reception of the reset signal, the level detecting part 52 judges whether the level of the monitoring signal has become higher than or equal to the threshold value.

When the judgment result has turned true, the level detecting part 52 supplies the initiation instant updating part 41R with a notice (completion notice) indicating that instant.

The initiation instant updating part 41R supplies the initiation controlling equipment 41PC with an elapsed time tn from reception of the initiation notice to reception of the completion notice.

The initiation controlling equipment 41PC sets a rise instant of a second signal at an instant that precedes a rise instant of a succeeding (n+1)th first signal by the time tn.

In the same manner as in the first and second embodiments, the initiation controlling equipment 41PC repeatedly generates the first signal and the second signal and thereby allows operation of the standard oscillator 71 and the phase lock oscillator 72 only in periods while the logical values of the second signal and the first signal (control signals) are equal to "1," respectively.

That is, the elapsed time from the instant when the standard oscillator 71 starts operating to the instant when the standard oscillator 71 initiates a stationary operation is actually measured according to a processing that is equivalent to the processings of the first and second embodiment and that is executed by the bandpass filter 51 and the level detecting part 52 instead of the above-described counter 41C and comparator 41TJ.

As long as the characteristics of the bandpass filter 51 is kept proper and stable, the judgment as to an initiation of stationary operation of the standard oscillator 71 based on the frequency of a reference signal generated by the standard oscillator 71, is performed more quickly with higher reliability than in a case where it is performed based on a result of counting of the clock signal by the counter 41C.

Therefore, according to this embodiment, the periods where the power should be consumed by the standard oscillator 71 is determined with higher reliability and the power saving is attained more stably than in the first and second embodiments.

In each of the above embodiments, the instant when the standard oscillator 71 initiates a stationary operation is detected as an instant when the frequency or the level of a reference signal generated by the standard oscillator 71 has become equal to the predetermined value.

However, the invention is not limited to such a configuration. For example, as long as the accuracy of detection of the above instant is secured, a configuration is possible in which the bandpass filter 51 (indicated by a broken line in FIG. 6) is not provided and the output of the standard oscillator 71 is directly connected to the level detecting part 52 without intervention of the bandpass filter 51 and the instant when the standard oscillator 71 initiates a stationary operation is judged only based on the level of the reference signal.

Figure 7:
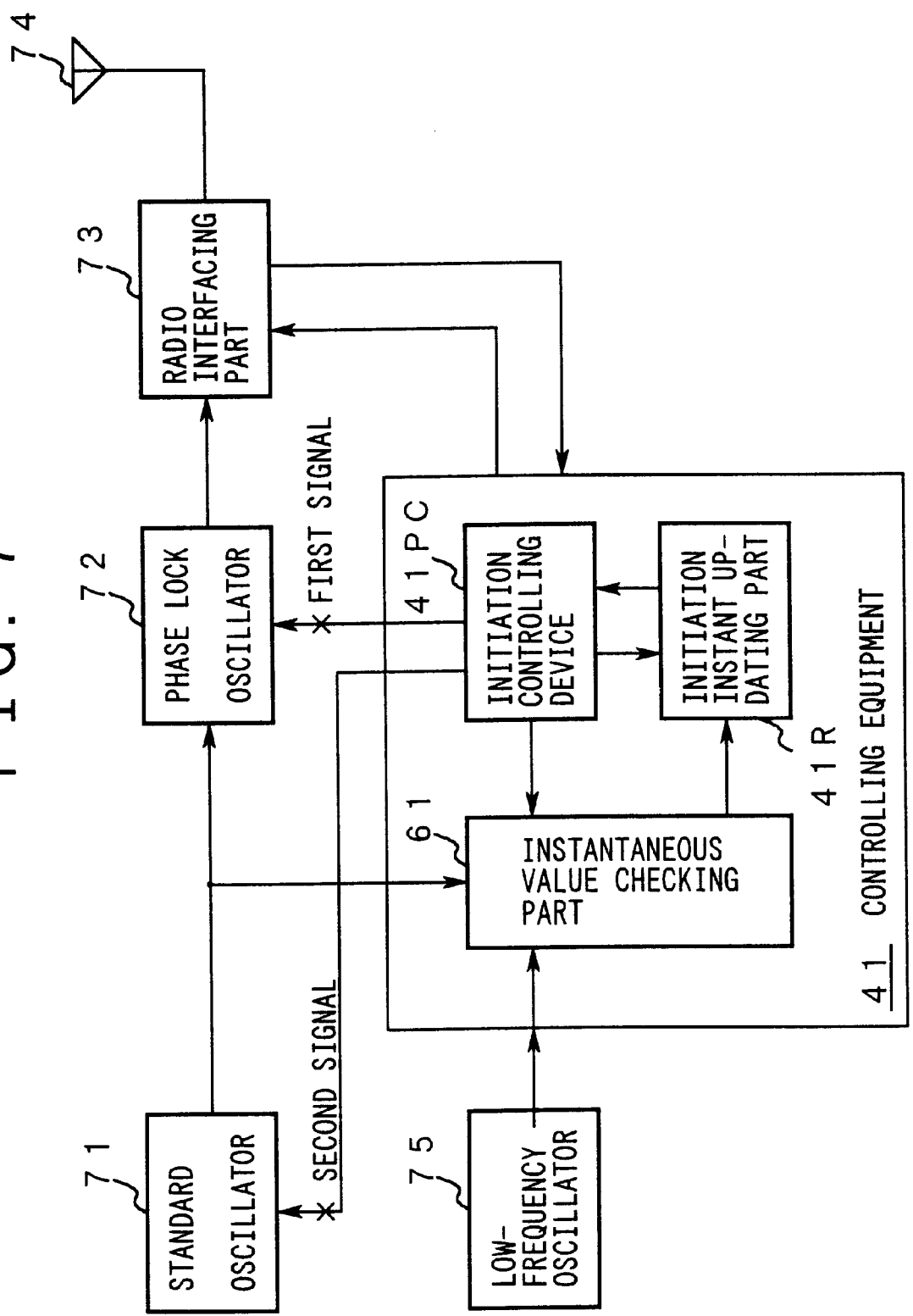
FIG. 7 shows a fourth embodiment of the invention.

FIG. 7 shows a fourth embodiment of the invention.

The parts in FIG. 7 having the same functions and configuration as the corresponding parts in FIG. 6 are given the same reference symbols and will not be described.

An important feature of this embodiment is that an instantaneous value checking part 61 is provided.

FIG. 8 shows the operation of the forth embodiment.

The instantaneous value checking part 61 is given in advance a lower limit value when the instantaneous value of a reference signal generated by the standard oscillator 71 should exceed, when the standard oscillator 71 initiates a stationary operation.

At an instant when to initiate the standard oscillator 71, the initiation controlling equipment 41PC gives the instantaneous value checking part 61 a reset signal and gives the initiation instant updating part 41R a notice indicating this instant.

Every time receiving the above notice, the initiation instant updating part 41R starts measuring a time tn from the reception of the notice to reception of a notice (completion notice; described later) that will be supplied from the instantaneous value checking part 61.

After the reception of the reset signal, the instantaneous value checking part 61 judges whether the instantaneous value of a reference signal generated by the standard oscillator 71 has exceeded the above-mentioned lower limit value. When the judgment result has turned true (indicated by symbol (1) in FIG. 8A), the instantaneous value checking part 61 supplies the initiation instant updating part 41R with a notice (completion notice) indicating this instant.

The initiation instant updating part 41R supplies the completion notice to the initiation controlling equipment 41PC.

The initiation controlling equipment 41PC sets a rise instant of a second signal at an instant that precedes a rise instant of a succeeding (n+1)th first signal by the time tn.

In the same manner as in the first to third embodiments, the initiation controlling equipment 41PC repeatedly generates the first signal and the second signal and thereby allows operation of the standard oscillator 71 and the phase lock oscillator 72 only in periods while the logical values of the second signal and the first signal (control signals) are equal to "1," respectively.

That is, the elapsed time from the instant when the standard oscillator 71 starts operating to the instant when the standard oscillator 71 initiates a stationary operation is actually measured according to a simple processing of determining a difference between the instantaneous value and the lower limit value of the reference signal.

Therefore, according to this embodiment, the configuration can be made simpler than in the first to third embodiments.

This embodiment has no specific disclosure as to the above-mentioned lower limit value. However, as long as the accuracy of each of the amplitude of a reference signal to be generated at an instant when the standard oscillator 71 initiates a stationary operation and a DC voltage to be superimposed on the reference signal is sufficiently high within the deviation of characteristics that may accompany the standard oscillator 71, the lower limit value may be any value suitable for the amplitude and the DC voltage.

In this embodiment, as shown in FIG. 8A, the lower limit value is set on condition that no DC voltage is superimposed on a reference signal generated by the standard oscillator 71 or a constant DC voltage is superimposed on it.

However, the invention is not limited to such a configuration. In a processing of initiating a stationary operation of the standard oscillator 71, a DC voltage to be superimposed on a reference signal generated by the standard oscillator 71 increases monotonously without varying uselessly (see FIG. 8B), the lower limit value may include the value of a DC voltage to be transitionally superimposed on the reference signal.

The invention may be applied to any electronic equipment that is provided with an oscillator that oscillates intermittently and a circuit that performs predetermined processing on a signal generated by the oscillator, and that is required to properly maintain an instant(s) when one or both of the oscillator and the circuit should be initiated to reduce power consumption due to useless operation of the circuit in a period while the oscillator is not in a stationary state.

However, it is desirable that the invention be applied particularly to equipments, such as terminal equipments in a mobile communication system, whose mountable battery has to have a limited capacity due to requirements of price reduction, downsizing, and lightening, and where it is strongly required to realize sufficiently long waiting state.

In terminal equipments to which the invention is applied, all of the above requirements are satisfied and the power consumption in a waiting state can be reduced by about 6%. Therefore, the continuous waiting can be maintained longer than in the conventional example.

In each of the above embodiments, the power is applied to the standard oscillator 71 intermittently with a lead of the initiation controlling equipment 41PC. However, the invention is not limited to such a configuration. For example, as long as the initiation controlling equipment 41PC operates, with reliable synchronization, in the periods while the power is supplied to the standard oscillator 71, one or both of the generation of the first signal and the supply of power may be performed independently by a circuit that is provided separately from the initiation controlling equipment 41PC.

In each of the above embodiments, the initiation controlling equipment 41PC uses the above-described time tn or Tn to determine the instant when to start supplying power to the phase lock oscillator 72.

However, the invention is not limited to such a configuration. For example, where an unallowably large error may occur in the process of acquiring an actual measurement value or performing computation based on the actual measurement values, the sum of the time tn (or Tn) and a margin having a value at which a reduction in occurrence of failure due to the error can be realized, can be applied in replace of the delay time tn (or Tn).

In each of the above embodiments, the power supply is started, at different instants, to the standard oscillator 71 and the phase lock oscillator 72, which are cascaded to generate a local frequency signal to be supplied to the radio interfacing part 73.

However, the invention is not limited such a configuration. For example, the invention can similarly be applied to any of the following equipments:

An equipment in which a circuit for performing one or a plurality of processing other than oscillation such as amplification, modulation, demodulation, coding, decoding, frequency conversion, frequency division, frequency multiplication, frequency mixing, and filtering in response to a reference signal generated by the standard oscillator 71 is provided instead of the phase lock oscillator 72.

An equipment that includes such a circuit (may include an oscillator) for performing one or a plurality of processing such as amplification, modulation, demodulation, coding, decoding, frequency conversion, frequency division, frequency multiplication, frequency mixing, and filtering and in which a circuit that requires a predetermined time to initiate a operation from an instant when it starts receiving power is provided instead of the standard oscillator 71.

An equipment in which a circuit for performing direct frequency synthesis is provided instead of the phase lock oscillator 72.

In each of the above embodiments, the above-described time tn (or Tn) is actually measured by the initiation instant updating part 41R. However, for example, the time tn (or Tn) may be determined as a time, which is from an initiation of operation of the standard oscillator 71 to an instant at which a preset condition(s) for one or a desired combination of the following items is satisfied (may be a time that is predicted on technical bases such as a circuit type rather than an actual measurement time):

The frequency of the reference signal.

The level (amplitude) of the reference signal.

The instantaneous value of the reference signal.

When necessary, the above condition may be updated to a condition suitable for the configuration (including the circuit type) of the standard oscillator 71, the channel control procedure, or the like.

In each of the above embodiment, no specific disclosure is made of the processing that is performed by the initiation controlling equipment 41P on the standard oscillator 71 in the periods while operation of the standard oscillator 71 should be prohibited.

However, as long as the useless power consumption of the standard oscillator 71 before the periods where the phase lock oscillator 72 should operate is reduced and the standard oscillator 71 operates reliably in a stationary state in the above period, the above processing may be of any of the following forms:

Processing of refraining from supplying power to the standard oscillator 71 (all or part of plural stages of circuits when the standard oscillator 71 consists of those stages of circuits).

Processing of prohibiting operation of all or part of circuits (stages) constituting the standard oscillator 71.

Processing of prohibiting a preceding stage from driving one or a plurality of stages other than the first stage in a case where the standard oscillator 71 consists of plural stages of circuits that are cascaded.

In each of the above embodiments, the standard oscillator 71 is initiated at the instant that secures a periods where the phase lock oscillator 72 and the circuits downstream thereof should operate and that precedes the above period by a shortest time that assures that the standard oscillator 71 operates in a stationary state in a reliable manner.

However, the invention is not limited to such a configuration. For example, in case variations in one or both of the cycle and the width of the period where the phase lock oscillator 72 and the subsequent circuits should operate, are tolerable, the instant when the phase lock oscillator 72 and the circuits downstream thereof starts operating may be varied instead of (or in addition to) the instant when the standard oscillator 71 should start operating as long as the reduction in power consumption is attained with desired accuracy.

The invention is not limited to the above embodiments and various modifications may be made without departing from the spirit and scope of the invention. Any improvement may be made in part or all of the components.

What is claimed is:

1. A controlling equipment having an initiation controlling section, for repeatedly executing initiation processing to initiate operation of an oscillator at a first instant and operation of a circuit at a second instant delaying from the first instant, the circuit using an output signal of the oscillator, wherein said initiation controlling section varies a length of time, which is between said first instant and said second instant in an Nth initiation processing, in accordance with a length of time, which is from an initiation of operation of said oscillator to said output signal satisfying a predetermined condition, during a (N−1) th or any one of its preceding initiation processings.

2. The controlling equipment according to claim 1, wherein said predetermined condition includes a condition in which there is one of an excess of a frequency of said output signal over a predetermined value and an excess of a level of said output signal over a predetermined value.

3. The controlling equipment according to claim 1, wherein said predetermined condition includes a condition that a frequency of said output signal reaches a predetermined value within predetermined accuracy.

4. The controlling equipment according to claim 1, wherein said predetermined condition includes a condition in which both a frequency and a level of said output signal exceed their respective predetermined values.

5. A controlling equipment having an initiation controlling section, for repeatedly executing initiation processing to initiate operation of an oscillator at a first instant and operation of a circuit at a second instant delaying from the first instant, the circuit using an output signal of the oscillator, wherein said initiation controlling section sets a length of time, which is between said first instant and said second instant in an Nth initiation processing, at:

T1 when a maximum value of a predetermined length of time is smaller than T1, in which the predetermined length of time is from an initiation of operation of said oscillator to said output signal satisfying a predetermined condition during a (N−1) th or any one of its preceding initiation processings; and T2, which is greater than T1, when said maximum value is greater than or equal to T1.

6. The controlling equipment according to claim 5, wherein said predetermined condition includes a condition in which there is one of an excess of a frequency of said output signal over a predetermined value and an excess of a level of said output signal over a predetermined value.

7. The controlling equipment according to claim 5, wherein said predetermined condition includes a condition that a frequency of said output signal reaches a predetermined value within predetermined accuracy.

8. The controlling equipment according to claim 5, wherein said predetermined condition includes a condition in which both a frequency and a level of said output signal exceed their respective predetermined values.

9. A controlling equipment having an initiation controlling section, for repeatedly executing initiation processing to initiate operation of an oscillator at a first instant and operation of a circuit at a second instant delaying from the first instant, the circuit using an output signal of the oscillator, wherein said initiation controlling section sets a length of time, which is between said first instant and said second instant in an Nth initiation processing, to be:

long when an average value of a predetermined length of time is large, in which the predetermined length of time is from an initiation of operation of said oscillator to said output signal satisfying a predetermined condition during a (N−1) th or any one of its preceding initiation processings; and short when said average value is small.

10. The controlling equipment according to claim 9, wherein said predetermined condition includes a condition in which there is one of an excess of a frequency of said output signal over a predetermined value and an excess of a level of said output signal over a predetermined value.

11. The controlling equipment according to claim 9, wherein said predetermined condition includes a condition that a frequency of said output signal reaches a predetermined value within predetermined accuracy.

12. The controlling equipment according to claim 9, wherein said predetermined condition includes a condition in which both a frequency and a level of said output signal exceed their respective predetermined values.

13. A controlling equipment having an initiation controlling section, for repeatedly executing initiation processing to initiate operation of an oscillator at a first instant and operation of a circuit at a second instant delaying from the first instant, the circuit using an output signal of the oscillator, wherein a measuring section measures a length of time by monitoring said output signal in each said initiation processing, the length of time being from an initiation of operation of said oscillator to said output signal satisfying a predetermined condition; and said initiation controlling section varies a length of time between said first instant and said second instant in accordance with a measurement result from said measuring section.

14. The controlling equipment according to claim 13, wherein said predetermined condition includes a condition in which there is one of an excess of a frequency of said output signal over a predetermined value and an excess of a level of said output signal over a predetermined value.

15. The controlling equipment according to claim 13, wherein said predetermined condition includes a condition that a frequency of said output signal reaches a predetermined value within predetermined accuracy.

16. The controlling equipment according to claim 13, wherein said predetermined condition includes a condition in which both a frequency and a level of said output signal exceed their respective predetermined values.

17. A controlling equipment having an initiation controlling section, for repeatedly executing initiation processing to initiate operation of an oscillator at a first instant and operation of a circuit at a second instant delaying from the first instant, the circuit using an output signal of the oscillator, wherein:

a measuring section measures a length of time in each initiation processing, the length of time being from an initiation of operation of said oscillator to said output signal satisfying a predetermined condition; and said initiation controlling section sets a length of time at a value equal to a sum of a predetermined time and a time measured by said measuring section, the length of time being between said first instant and said second instant.

18. The controlling equipment according to claim 17, wherein said predetermined condition includes a condition in which there is one of an excess of a frequency of said output signal over a predetermined value and an excess of a level of said output signal over a predetermined value.

19. The controlling equipment according to claim 17, wherein said predetermined condition includes a condition that a frequency of said output signal reaches a predetermined value within predetermined accuracy.

20. The controlling equipment according to claim 17, wherein said predetermined condition includes a condition in which both a frequency and a level of said output signal exceed their respective predetermined values.

21. A radio equipment comprising:

an oscillator;

a reception processing part for performing reception processing on a radio signal reaching an antenna, according to an output signal of said oscillator;

a controlling equipment for causing said reception processing part to intermittently perform said reception processing at a predetermined cycle by initiating said oscillator at a first instant and said reception processing part at a second instant, which delays from said first instant, the predetermined cycle being suitable for a signal reaching said antenna from a base station and;

a measuring section for measuring a length of time by monitoring said output signal in each said reception processing, the length of time being from an initiation of operation of said oscillator to said output signal satisfying a predetermined condition; and an initiation controlling section for varying said first instant in accordance with a measurement result from said measuring section.

22. The radio equipment according to claim 21, wherein said predetermined condition includes one of an excess of a frequency of said output signal over a predetermined value and an excess of a level of said output signal over a predetermined value.

23. The radio equipment according to claim 21, wherein said predetermined condition includes a condition that a frequency of said output signal reaches a predetermined value within predetermined accuracy.

24. The radio equipment according to claim 21, wherein said predetermined condition includes a condition in which both a frequency and a level of said output signal exceed their respective predetermined values.

* * * * *